US006989711B2

(12) United States Patent
Camnitz et al.

(10) Patent No.: US 6,989,711 B2
(45) Date of Patent: Jan. 24, 2006

(54) SECTIONAL POWER/VOLTAGE/CURRENT LIMITER FOR A MULTI-PHASE AMPLIFIER

(75) Inventors: Lovell H. Camnitz, Santa Clara, CA (US); Chul Park, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 111 days.

(21) Appl. No.: 10/795,026

(22) Filed: Mar. 5, 2004

(65) Prior Publication Data

US 2005/0195026 A1 Sep. 8, 2005

(51) Int. Cl.
*H03F 3/68* (2006.01)

(52) U.S. Cl. .................. 330/124 R; 330/149; 330/107

(58) Field of Classification Search ............ 330/124 R, 330/149, 107, 286, 53
See application file for complete search history.

(56) References Cited

U.S. PATENT DOCUMENTS

| 4,331,263 A | * | 5/1982 | Brown ........................ 222/63 |
| 5,291,148 A | * | 3/1994 | Reisner et al. .............. 330/149 |
| 5,576,660 A | * | 11/1996 | Pouysegur et al. ......... 330/149 |
| 5,886,573 A | * | 3/1999 | Kolanek ...................... 330/10 |
| 5,995,819 A | * | 11/1999 | Yamaji et al. .............. 455/326 |
| 6,137,354 A | * | 10/2000 | Dacus et al. ................. 330/51 |

* cited by examiner

*Primary Examiner*—Patricia Nguyen
(74) *Attorney, Agent, or Firm*—Pamela Lau Kee

(57) ABSTRACT

A power splitter receives power and has a first and second power output. The first power output is connected first power limiting section. A first matching circuit connects between an output of the first power limiting section and a first phase shifter. A second phase shifter connects between the second power output and a second power limiting section. An output of the second limiting section connects to a second matching circuit. A power combiner receives the output of the first phase shifter and the second matching circuit output. The power from the power combiner is delivered to the load.

7 Claims, 5 Drawing Sheets

• Prior Art

• Prior Art

SECTIONAL POWER/VOLTAGE/CURRENT LIMITER FOR A MULTI-PHASE AMPLIFIER

BACKGROUND

Radio frequency (RF) amplifiers misbehave when subjected to non-matched loads. They can draw too much current, have distorted output signals, or are even damaged during operation.

FIG. 1 illustrates one prior art example to control the misbehavior is to use a voltage detector/gain controller. While this method prevents excessive output voltage and consequent excess distortion, it results in an excess reduction in power delivered to the load.

FIG. 2 illustrates another prior art example, a phase staggered multi-stage amplifier. The power delivered to the load is maintained but there is distortion and excess current per section. Phase staggering causes the individual sections of the amplifier to alternate in the characteristic, e.g. excess current in one section, excess voltage in the other. While this equalizes the overall gain and current draw, each section individually suffers.

SUMMARY

A power splitter receives power. A first power output is connected to the first limiting section. A first matching circuit connects between an output of the first limiting section and a first phase shifter. A second phase shifter connects between the second power output and a second limiting section. An output of the second limiting section connects to a second matching circuit. A power combiner receives as inputs the output of the first phase shifter and output of the second matching circuit. The power from the power combiner is delivered to the load.

DETAILED DESCRIPTION

Figure 1:
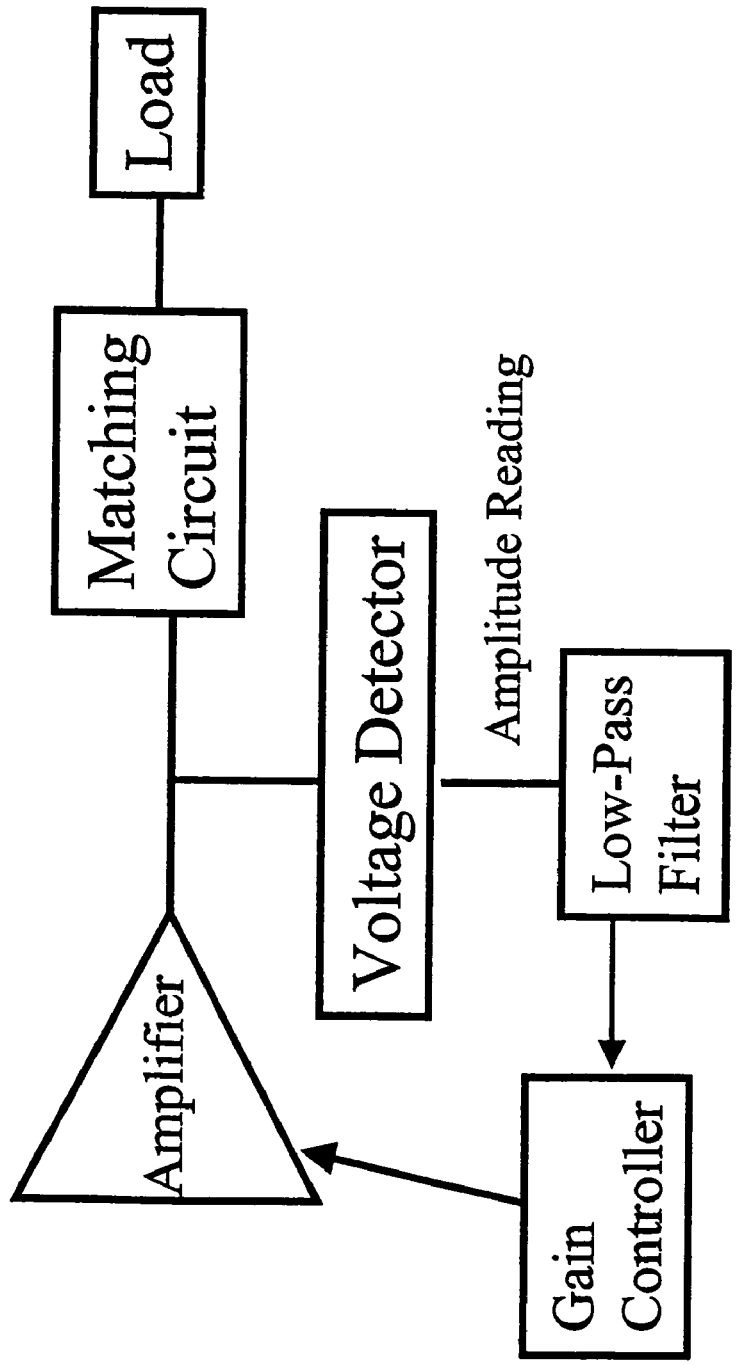
FIG. 1 illustrates an example of the prior art
Figure 2:
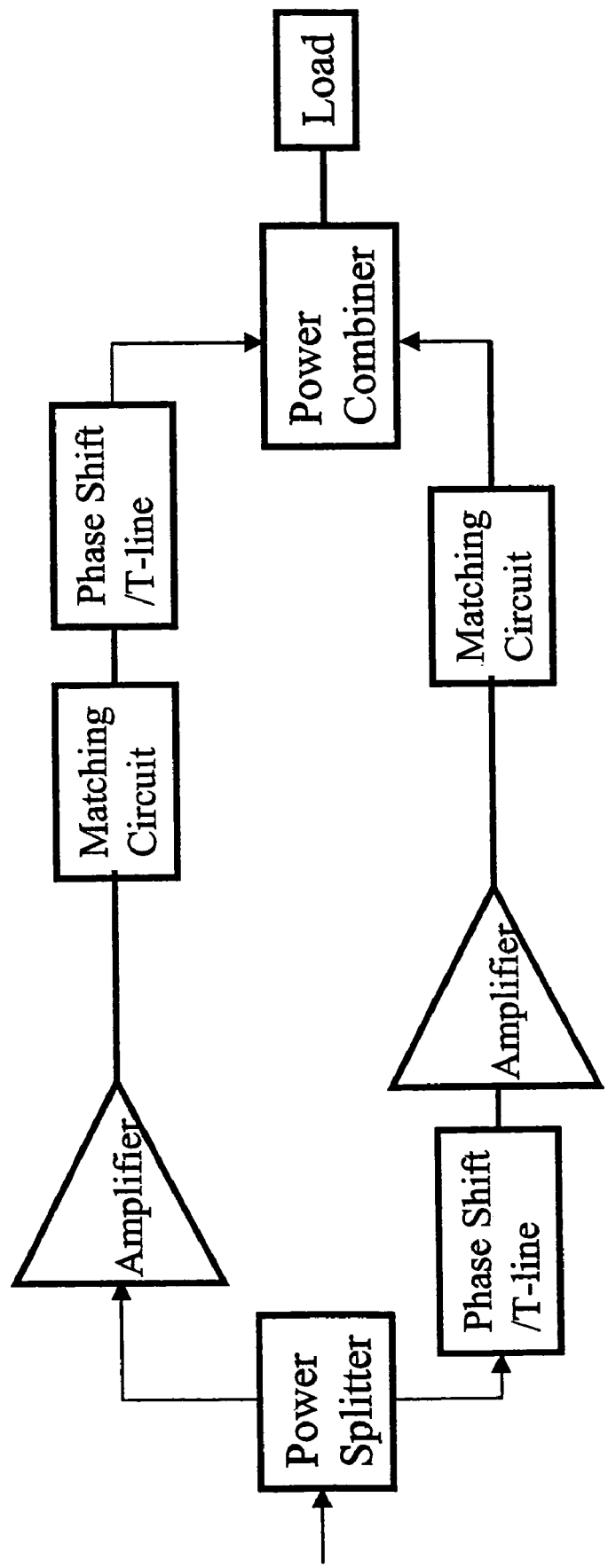
FIG. 2 illustrates another example of the prior art.
Figure 3:
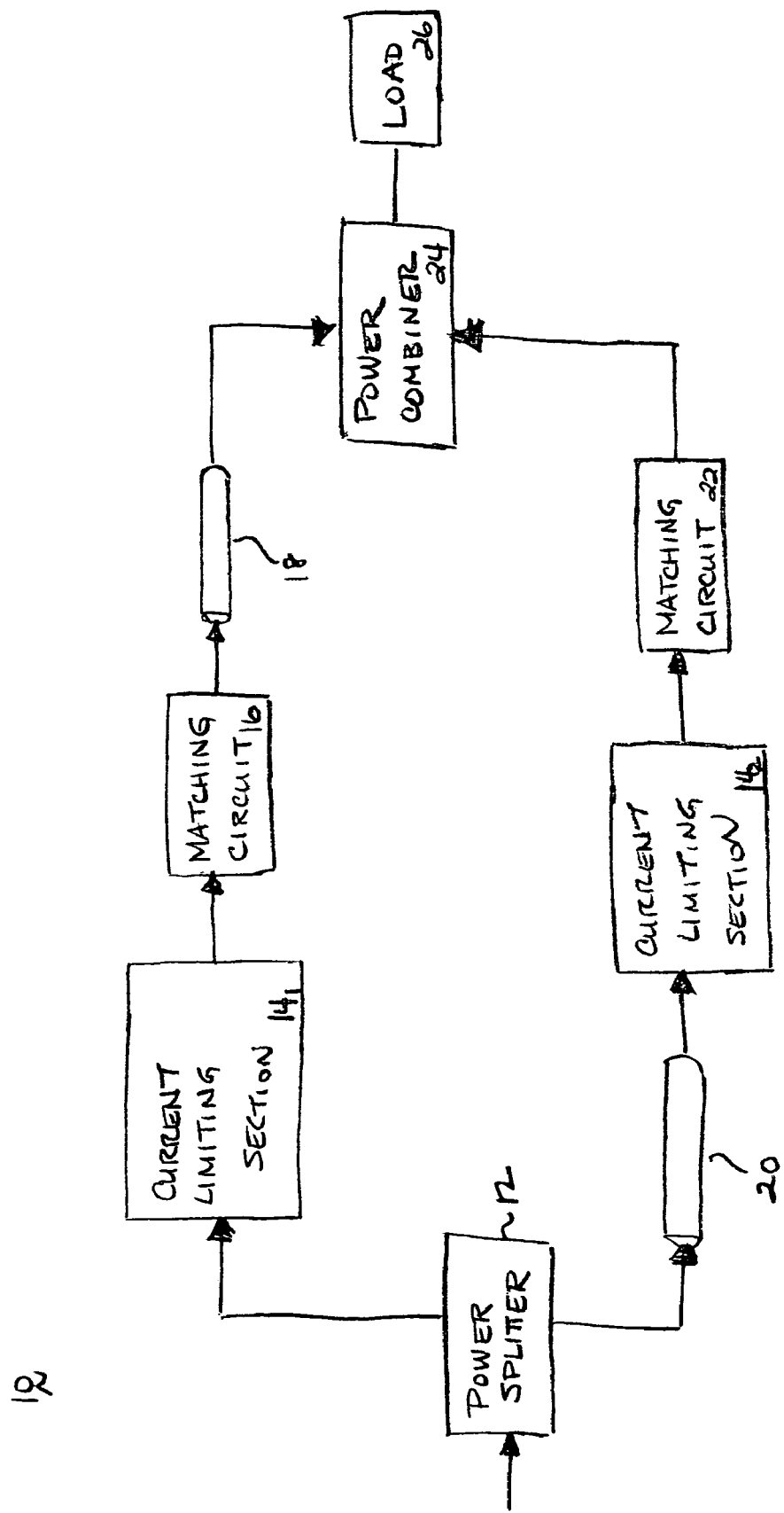
FIG. 3 illustrates a generic functional block diagram according to the invention.

FIG. 3 illustrates a generic functional block diagram 10 according to the invention. A power splitter 12 receives power and has a first and second power output. The first power output is connected first power limiting section $14_1$. A first matching circuit 16 connects between an output of the first power limiting section $14_1$ and a first phase shifter 18, e.g. transmission line. A second phase shifter 20 connects between the second power output and a second power limiting section $14_2$. An output of the second power limiting section $14_2$ connects to a second matching circuit 22. A power combiner 24 receives as inputs the output of the first phase shifter 18 and the output of the second matching circuit 20. The power from the power combiner 24 is delivered to the load 26.

In each embodiment of the power limiting sections to be described, an amplifier receives the inputs from an earlier block and provides the output to the associated matching circuit.

Figure 4:
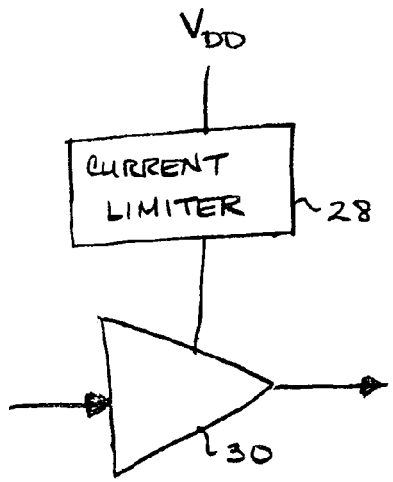
FIG. 4 illustrates an embodiment of the power limiting section shown in FIG. 3.

FIG. 4 illustrates an embodiment for one of the power limiting sections $14_x$ shown in FIG. 3. A current limiting circuit 28, connected to a power supply Vdd, provides power to an amplifier 30.

In operation, the current limiting circuit 28 limits the current supplied by the amplifier 30 to the load when the amplifier is operating in saturation.

Figure 5:
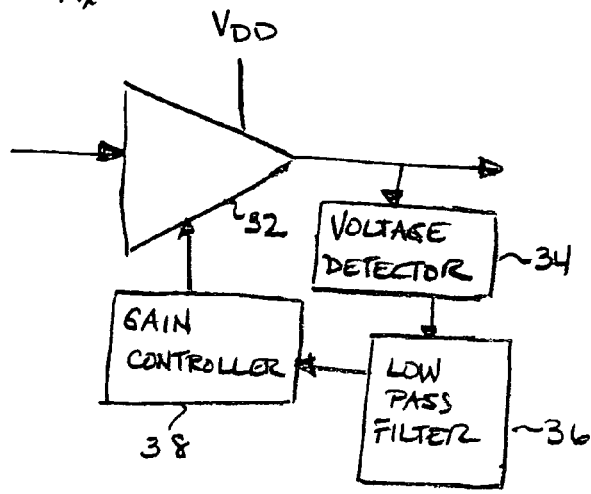
FIG. 5 illustrates an embodiment of the power limiting section shown in FIG. 3.

FIG. 5 illustrates an alternate embodiment for one of the power limiting sections $14_x$ shown in FIG. 3. An output of a variable gain amplifier 32 connects to a voltage detector 34. A low pass filter 36 connects between the voltage detector output and a gain controller 38. The gain controller 38 is applied to the variable gain amplifier 32.

Figure 6A:
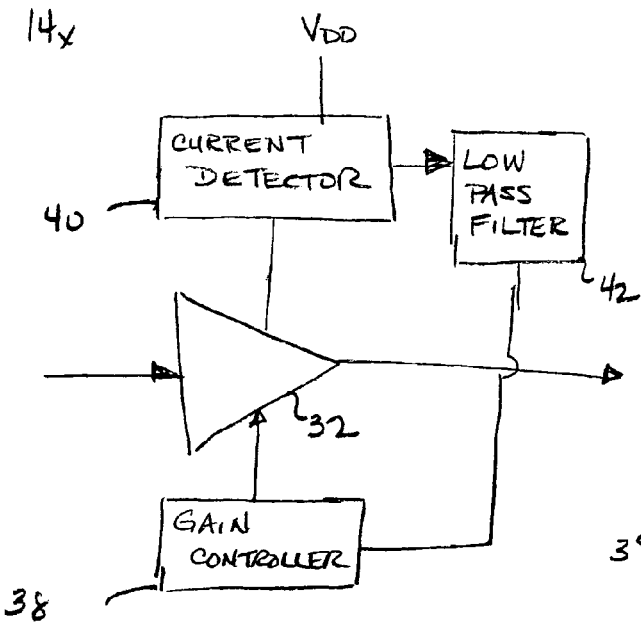
FIGS. 6A and 6B illustrate an embodiment of the power limiting section shown in FIG. 3.

FIG. 6A illustrates an alternate embodiment for the power limiting sections $14_x$ shown in FIG. 3. A current detector 40 connects between Vdd (not shown) and provides power to a variable gain amplifier 32. A low pass filter 42 connects between the output of the current detector 40 and a gain controller 46. The output of the gain controller 46 is applied to the variable gain amplifier 42.

Figure 6B:
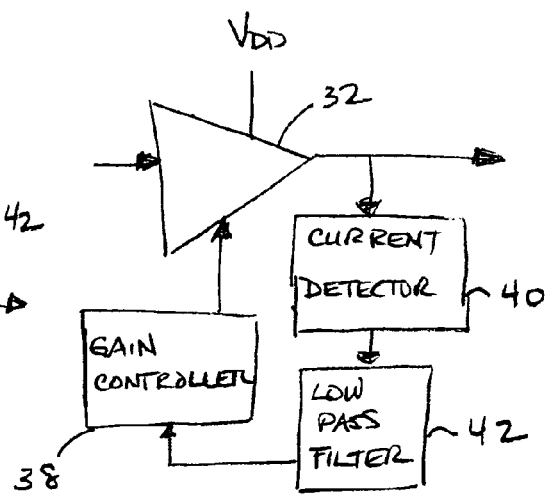

Alternatively, as shown in FIG. 6B, the current detector may sample the current at the variable gain amplifier output. The current detector 40 receives the output of the variable gain amplifier 32. The low pass filter 42 connects betweens the output of the current detector 40 and the gain controller 38. The output of the gain controller 38 is applied to the variable gain amplifier 32.

In the embodiments shown in FIGS. 5, 6A, and 6B, the circuit prevents amplifier limiting by reducing the gain when the selected parameter reaches a pre-set value. Below the limiting value, the gain is held constant. In FIG. 5, the selected parameter is voltage. In FIGS. 6A and 6B, the selected parameter is current.

Figure 7:
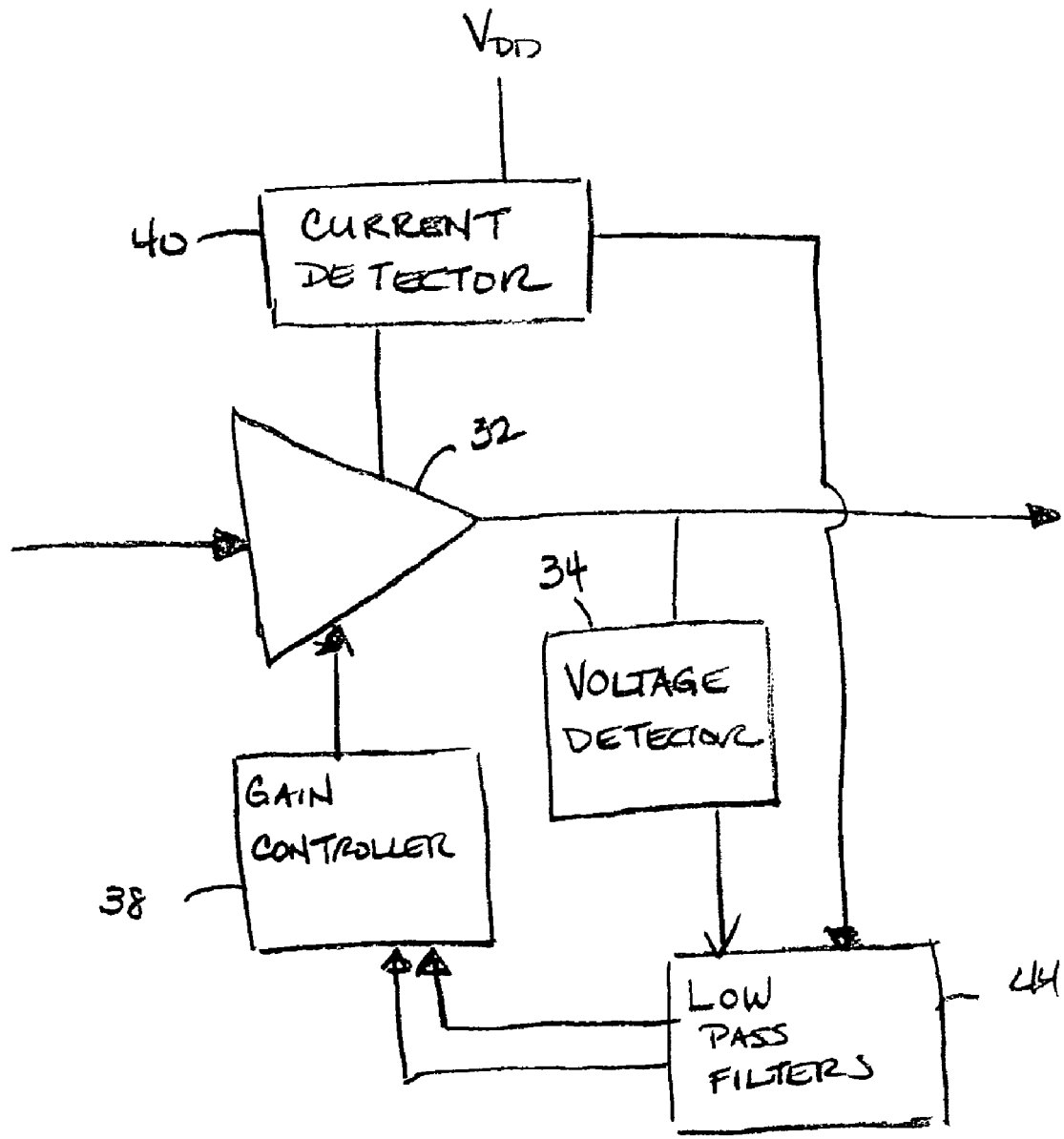
FIG. 7 illustrates an embodiment of the power limiting section shown in FIG. 3.

FIG. 7 illustrates an alternate embodiment for the power limiting sections $14_x$ shown in FIG. 3. A voltage detector 34 connects between a variable gain amplifier 32 and low pass filters 44. A gain controller 38 connects between the outputs of the low pass filters 44 and the gain input of the respective variable gain amplifier 32. A current detector 40 connects between Vdd (not shown) and provides power to the variable gain amplifier 32. The low pass filters 44 receive the output of the current detector 40.

In operation, both output current and voltage are measured and filtered. If either voltage or current reach the pre-set values, the gain is reduced in the amplifier. Thus both the current and voltage values are prevented from going too high, preventing distortion and reducing the maximum current draw of the amplifier.

In all of the disclosed embodiments, one with skill in the art will appreciate that the functionality of matching, phase shifting, amplifying, splitting, and combining can be realized in several ways. To illustrate, phase shifting can be combined with splitting or combining in a 'quadrature hybrid' or 90-degree coupler. Alternatively, the matching circuit might be integral to the amplifier or even to the phase shifter or combiner.

What is claimed is:
1. A circuit comprising:
   a power splitter, receiving power, having two power outputs;
   a first limiting circuit, receiving one of the two power outputs, having a first limiting output;

a first matching circuit, receiving the first limiting output, having an output;

a first phase shifter, having a first phase output, receiving the output of the first matching circuit;

a second phase shifter, receiving the other of the two power outputs, having a second phase output;

a second limiting circuit, receiving the second phase output, having a second limiting output;

a second matching circuit, receiving the second limiting output, having a second matching output; and a power combiner, receiving the first phase output and the second matching output, generating a combined power output.

2. A circuit, as defined in claim 1, one of the first and second limiting circuits comprising:

a current limiting circuit, connected to a power supply, having an output; and an amplifier, receiving the output of the current limiting circuit, having an input and output.

3. A circuit, as defined in claim 1, one of the first and second limiting circuits further comprising:

a variable gain amplifier, connected to a power supply, having an input, an amplifier output, and gain input;

a detector, receiving the amplifier output, generating a detector output;

a low pass filter, receiving the detector output, having a filter output; and a gain controller, receiving the filter output, connected to the gain input.

4. A circuit, as defined in claim 3, wherein the detector is a current detector.

5. A circuit, as defined in claim 3, wherein the detector is a voltage detector.

6. A circuit, as defined in claim 1, one of the first and second limiting circuits further comprising:

a variable gain amplifier, having an input, output, and gain input;

a current detector connects between a power supply Vdd and the variable gain amplifier, having a detector output;

a low pass filter, receiving the detector output, having a filter output; and a gain controller, receiving the filter output, connected to the gain input.

7. A circuit, as defined in claim 6, one of the first and second limiting circuits further comprising:

a second low pass filter, connected to the gain controller; and a voltage detector, receiving the output of the variable gain amplifier, connected to the second low pass filter.

* * * * *